United States Patent
Kitagawa

(10) Patent No.: US 9,559,710 B2
(45) Date of Patent: Jan. 31, 2017

(54) SEMICONDUCTOR DEVICE INCLUDING OSCILLATOR

(71) Applicant: Micron Technology, Inc., Boise, ID (US)

(72) Inventor: Katsuhiro Kitagawa, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/745,118

(22) Filed: Jun. 19, 2015

(65) Prior Publication Data
US 2015/0372685 A1 Dec. 24, 2015

(30) Foreign Application Priority Data
Jun. 24, 2014 (JP) ................. 2014-129560

(51) Int. Cl.
| | | |
|---|---|---|
| H03K 3/03 | (2006.01) | |
| H03L 7/099 | (2006.01) | |
| H03L 7/10 | (2006.01) | |
| H03L 7/081 | (2006.01) | |
| G11C 7/10 | (2006.01) | |
| G11C 7/22 | (2006.01) | |
| G11C 11/4076 | (2006.01) | |
| G11C 11/4093 | (2006.01) | |

(52) U.S. Cl.
CPC ............. *H03L 7/10* (2013.01); *G11C 7/1066* (2013.01); *G11C 7/1093* (2013.01); *G11C 7/222* (2013.01); *G11C 11/4076* (2013.01); *G11C 11/4093* (2013.01); *H03K 3/0315* (2013.01); *H03L 7/0814* (2013.01); *H03L 7/0816* (2013.01); *H03L 7/0997* (2013.01); *H03L 7/0998* (2013.01)

(58) Field of Classification Search
CPC ... H03K 3/0315; H03L 7/0997; H03L 7/0998; H03L 7/081
USPC .......................................... 331/57
See application file for complete search history.

(56) References Cited

U.S. PATENT DOCUMENTS

| | | | | |
|---|---|---|---|---|
| 5,689,213 A * | 11/1997 | Sher | ...................... | G11C 11/406 327/276 |
| 5,861,780 A * | 1/1999 | Fukuda | ................ | H03K 3/0315 331/179 |
| 7,230,498 B2 * | 6/2007 | Osvaldella | ............ | H03K 5/133 327/158 |
| 7,403,074 B2 * | 7/2008 | Takahashi | ............ | H03K 3/0315 327/295 |
| 2006/0132204 A1* | 6/2006 | Kumata | ................... | G11C 7/02 327/158 |
| 2013/0037697 A1* | 2/2013 | Kato | .................... | H03K 3/0315 250/208.1 |

FOREIGN PATENT DOCUMENTS

| | | |
|---|---|---|
| JP | 2008-210436 | 9/2008 |
| JP | 2010-117846 | 5/2010 |

* cited by examiner

*Primary Examiner* — Ryan Johnson
(74) *Attorney, Agent, or Firm* — Dorsey & Whitney LLP

(57) ABSTRACT

According to the present invention, a ring oscillator coupled to an output node operable to output a clock signal including a first logic level generated by a first odd number of delay circuits, and a second logic level different from the first logic level generated by a second odd number of delay circuits different from the first odd number of delay circuits.

16 Claims, 15 Drawing Sheets

SEMICONDUCTOR DEVICE INCLUDING OSCILLATOR

CROSS-REFERENCE TO RELATED APPLICATION

This application is based upon and claims the benefit of priority from Japanese Patent Application No. 2014-129560, filed on Jun. 24, 2014, the disclosure of which is incorporated herein in its entirety by reference.

BACKGROUND OF THE INVENTION

Field of the Invention

The present invention relates to a ring oscillator and a semiconductor device having the ring oscillator and particularly to a ring oscillator with a variable loop length and a semiconductor device having the ring oscillator.

Background

A ring oscillator is a circuit that generates a pulse having a given frequency through odd units of circularly connected delay circuits and is incorporated in many types of semiconductor devices. The ring oscillator is used mainly for generating a clock signal. Japanese Laid-Open Patent Publication No. 2010-117846 describes an example in which a ring oscillator is used as a random number generator.

The ring oscillator is also used for measuring the cycle of an incoming external clock signal. Clock single cycle measurement using the oscillator can be applied to a DLL (Delay Locked Loop) circuit, a DCC (Duty Cycle Corrector) circuit, etc., incorporated in a DRAM (Dynamic Random Access Memory), etc. A DRAM including a DCC circuit is disclosed in, for example, Japanese Laid-Open Patent Publication No. 2008-210436.

DETAILED DESCRIPTION OF THE EMBODIMENTS

This invention will be described herein with reference to illustrative embodiments. Those skilled in the art will recognize that many alternative embodiments can be accomplished using the teachings of the present invention and that the invention is not limited to the embodiments illustrated for explanatory purposes.

Preferred embodiments of the present invention will now be described with reference to the accompanying drawings.

Figure 1:
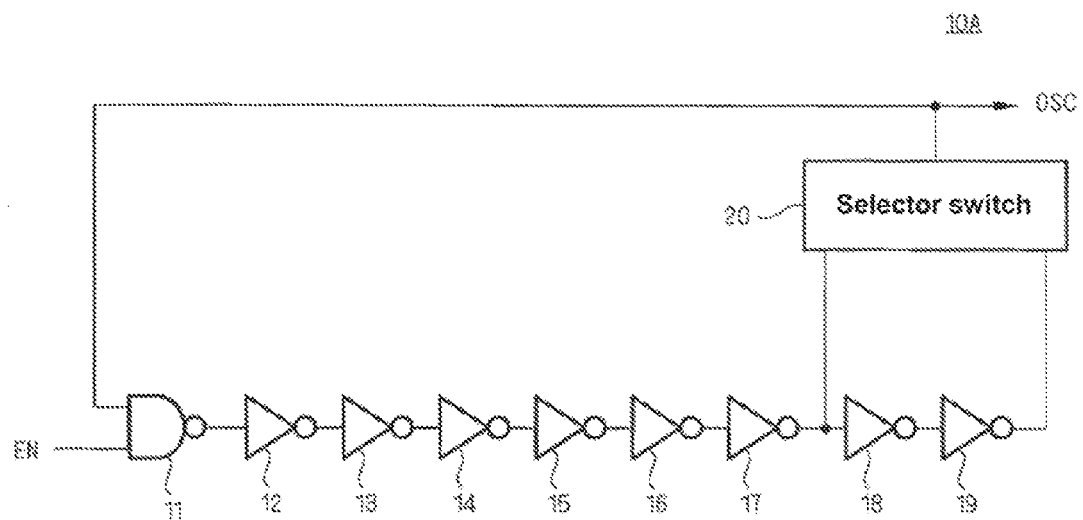
FIG. 1 is a circuit diagram of a configuration of a ring oscillator 10A according to a first embodiment of the present invention.

FIG. 1 is a circuit diagram of a configuration of a ring oscillator 10A according to a first embodiment of the present invention.

As shown in FIG. 1, the ring oscillator 10A according to the first embodiment includes one NAND gate circuit 11 and eight inverter circuits 12 to 19 that serve as delay circuits. These delay circuits 11 to 19 are connected in series, and output from them is fed back to one input node of the NAND gate circuit 11 via a selector switch 20. An enable signal EN is input to the other input node of the NAND gate circuit 11. The enable signal EN is a signal that activates the ring oscillator 10A. The enable signal EN at a high-voltage level, therefore, causes the oscillator signal OSC to oscillate. In the example of FIG. 1, the oscillator signal OSC is output from the output node of the selector switch 20. The oscillator signal OSC, however, may be output from the output node of the NAND gate circuit 11 or the output nodes of the inverter circuits 12 to 17. This holds true also for other embodiments that will be described later.

The selector switch 20 alternately selects either the oscillator signal OSC output from the output node of the inverter circuit 17 or the oscillator signal OSC output from the output node of the inverter circuit 19. This alternate oscillator signal selection creates a first oscillator ring composed of seven delay circuits 11 to 17 and a second oscillator ring composed of nine delay circuits 11 to 19. Hence the oscillator signal OSC alternately propagates through the first oscillator ring and the second oscillator ring.

Figure 2:
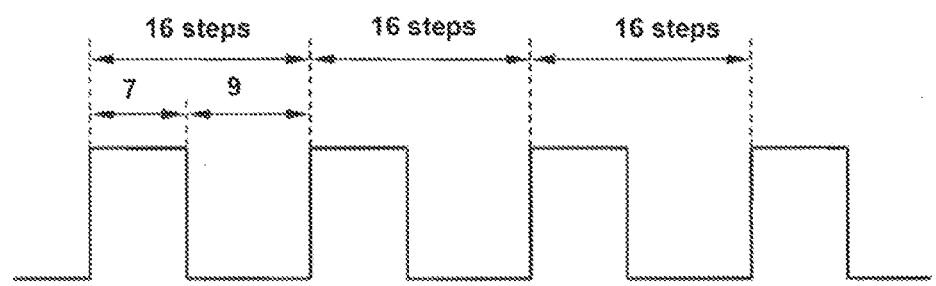
FIG. 2 is a waveform chart of an oscillator signal OSC generated by the ring oscillator 10A.

FIG. 2 is a waveform chart of the oscillator signal OSC generated by the ring oscillator 10A.

As shown in FIG. 2, during a high-voltage level period between a rising edge and a falling edge of the oscillator signal OSC, the first oscillator ring is selected. The length of the high-voltage level period is, therefore, defined as a delay time created by seven units of delay circuits 11 to 17. During a low-voltage level period between a failing edge and a rising edge of the oscillator signal OSC, on the other hand, the second oscillator ring is selected. The length of the low-voltage level period is, therefore, defined as a delay time created by nine units of delay circuits 11 to 19. As a result, one cycle of the oscillator signal OSC has a length equivalent to a delay time created by 16 units of delay circuits. Hence a period defined, as a delay time created by even units of delay circuits is obtained.

According to this embodiment, the first oscillator ring is composed of seven delay circuits and the second oscillator ring is composed of nine delay circuits. The present invention, however, is not limited to this configuration. A configuration in which the first oscillator ring is composed of M delay circuits (M denotes an odd number) and the second oscillator ring is composed of N delay circuits (N denotes an odd number different from M) is considered to be applicable according to the present invention. This holds true also for other embodiments.

Figure 3:
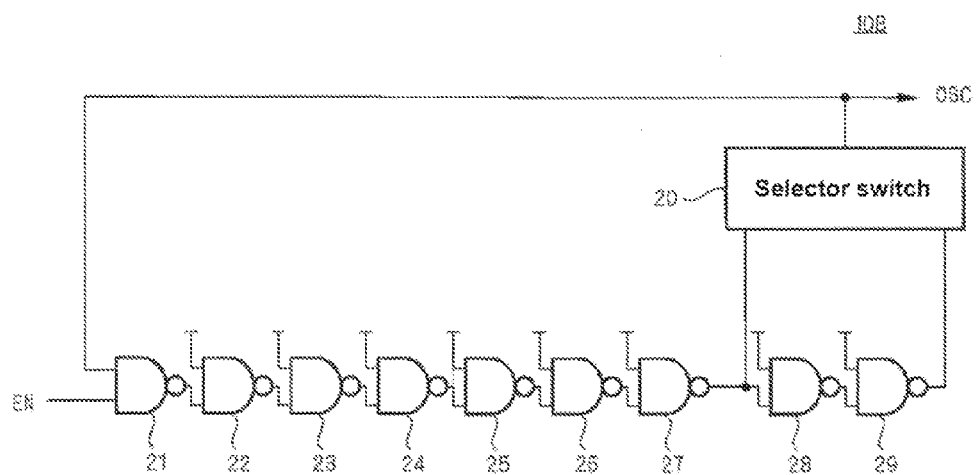
FIG. 3 is a circuit diagram of a configuration of a ring oscillator 10B according to a second embodiment of the present invention.

FIG. 3 is a circuit diagram of a configuration of a ring oscillator 10B according to a second embodiment of the present invention.

As shown in FIG. 3, the ring oscillator 10B according to tire second embodiment is different from the ring oscillator 10A of FIG. 1 in that all the delay circuits are NAND gate circuits, i.e., NAND gate circuits 21 to 29. In other aspects, the ring oscillator 10B is the same as the ring oscillator 10A, and therefore the same elements will be denoted by the same reference numerals and redundant description will be omitted.

According to this embodiment, the enable signal EN at a high-voltage level causes the oscillator signal USC to oscillate. In order to control the start and stoppage of oscillation of the oscillator signal USC, a two-input logical gate circuit supplied with the enable signal EN is necessary. In this embodiment, the NAND gate circuit 21 is used as such a logical gate circuit. As in the case of the ring oscillator of the first embodiment shown in FIG. 1, when the NAND gate circuit 21 and the inverter circuits 12 to 19 are used, their respective delay times are not substantially the same. According to the second embodiment, however, all the delay circuits are provided as two-input NAND gate circuits, i.e., the NAND gate circuits 21 to 29, respectively. As a result, a delay time per unit of delay circuit becomes substantially the same.

The output node of each NAND gate circuit at a preceding stage is connected to one input node of each NAND gate circuit at a subsequent stage as the other input nodes of the NAND gate circuits 22 to 29 at the second to ninth stages are uniformly fixed to the high-voltage level. Hence the similar loop as that of the first embodiment is formed. In this manner, according to this embodiment, a delay time per unit of delay circuit is equalized. This facilitates circuit designing for generating the oscillator signal OSC with a desired frequency.

Figure 4:
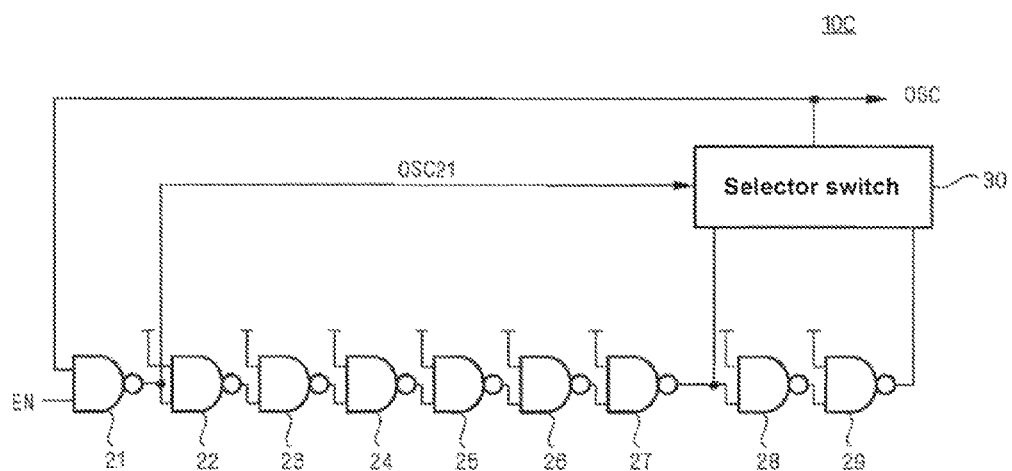
FIG. 4 is a circuit diagram of a configuration of a ring oscillator 10C according to a third embodiment of the present invention.

FIG. 4 is a circuit diagram of a configuration of a ring oscillator 10C according to a third embodiment of the present invention.

As shown in FIG. 4, the ring oscillator 10C according to the third embodiment is different from the ring oscillator 10B of FIG. 3 in that the ring oscillator 10C includes a selector switch 30 controlled by an oscillator signal OSC21. In other aspects, the ring oscillator 10C is substantially the same as the ring oscillator 10B, and therefore the same elements will be denoted by the same reference numerals and redundant description will be omitted.

The oscillator signal OSC21 is an output signal from the NAND gate circuit 21, and the selector switch 30 carries out a selection operation based on the logical level of the oscillator signal OSC21. Specifically, when the oscillator signal OSC21 is at a high-voltage level, the selector switch 30 selects an output signal from the NAND gate circuit 27, thus, the first oscillator ring composed of seven units of delay circuits becomes effective. When the oscillator signal OSC21 is at a low-voltage level on the other hand, the selector switch 30 selects an output signal from the NAND gate circuit 29, thus, the second oscillator ring composed of nine units of delay circuits becomes effective. Controlling the operation of the selector switch 30 by the oscillator signal OSC21 is, however, not mandatory. For example, the operation of the selector switch 30 may be controlled using output signals from other NAND gate circuits 22 to 29.

In such a configuration, the first or second oscillator ring becomes effective alternately every time the oscillator signal OSC21 alternates between voltage levels. This allows autonomous generation of the oscillator signal OSC having a cycle equivalent to a delay time created by 16 units of delay circuits.

Figure 5:
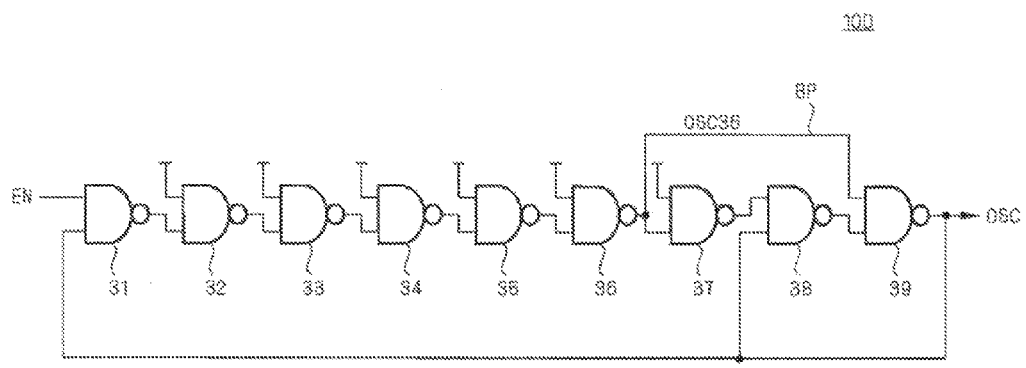
FIG. 5 is a circuit diagram of a configuration of a ring oscillator 10D according to a fourth embodiment of the present invention.

FIG. 5 is a circuit diagram of a configuration of a ring oscillator 10D according to a fourth embodiment of the present invention.

As shown in FIG. 5, the ring oscillator 10D according to the fourth embodiment is configured such that nine NAND gate circuits 31 to 39 are connected circularly and that the output node of each NAND gate circuit at the preceding stage is connected to one input node of each NAND gate circuit at the subsequent stage. The NAND gate circuit 31 has the other input node supplied with the enable signal EN. The NAND gate circuit 38 has the other input node connected to the output node of the NAND gate circuit 39, which has the other input node connected to the output node of the NAND gate circuit 37. Other NAND gate circuits 32 to 37 have the other input nodes uniformly fixed to the high-voltage level.

In this configuration, the enable signal EN at high-voltage level causes the oscillator signal OSC to start oscillating. However, the loop length changes depending on the logical level of an oscillator signal OSC36 output from the NAND gate circuit 36.

When the oscillator signal OSC36 is at the high-voltage level, the other input node of the NAND gate circuit 39 shifts to the high-voltage level because of the oscillator signal OSC36 input thereto via a bypass route BP. As a result, the NAND gate circuit 39 becomes effective, which means that the output voltage level of the NAND gate circuit 39 changes depending on the output voltage level of the NAND gate circuit 38. At timing at which the oscillator signal OSC36 shifts from low-voltage level to high-voltage level the oscillator signal OSC output from the NAND gate circuit 39 is always at high-voltage level, in which case the NAND gate circuit 38 is also effective. The oscillator signal OSC36 having shifted from a low-voltage level to the high-voltage level thus propagates through a route of traveling through the NAND gates 37 and 38 (second oscillator ring) and causes the oscillator signal OSC output from the NAND gate circuit 39 to shift from the high-voltage level to the low-voltage level. In other words, the bypass route BP is rendered ineffective in this case.

When the oscillator signal OSC36 is at low-voltage level, the other input node of the NAND gate circuit 39 shifts to the low-voltage level because of the oscillator signal OSC36 input thereto via the bypass route BP. As a result, the oscillator signal OSC output from the NAND gate circuit 39 immediately shifts to the high-voltage level. In this case, the bypass route BP is rendered effective, allowing the oscillator signal OSC36 to propagate through a route of bypassing the NAND gate circuits 37 and 38 (first oscillator ring).

The above operation is performed alternately every time the logical level of the oscillator signal OSC shifts. In the same manner as in the first to third embodiments, therefore, the first oscillator ring having seven units of delay circuits (delay circuits 31 to 37) and the second oscillator ring having nine unite of delay circuits (delay circuits 31 to 39) become effective alternately. This allows autonomous generation of the oscillator signal OSC having the cycle equivalent to the delay time created by 16 units of delay circuits. According to this embodiment, because the other input node of the NAND gate circuit 39 functions as a selector switch, providing a separate selector switch is not necessary.

According to this embodiment two NAND gate circuits 37 and 38 are bypassed by using the bypass route BP. When the total of the delay circuits is N, bypassing P (P denotes an even number smaller than N) delay circuits is enough.

Figure 6:
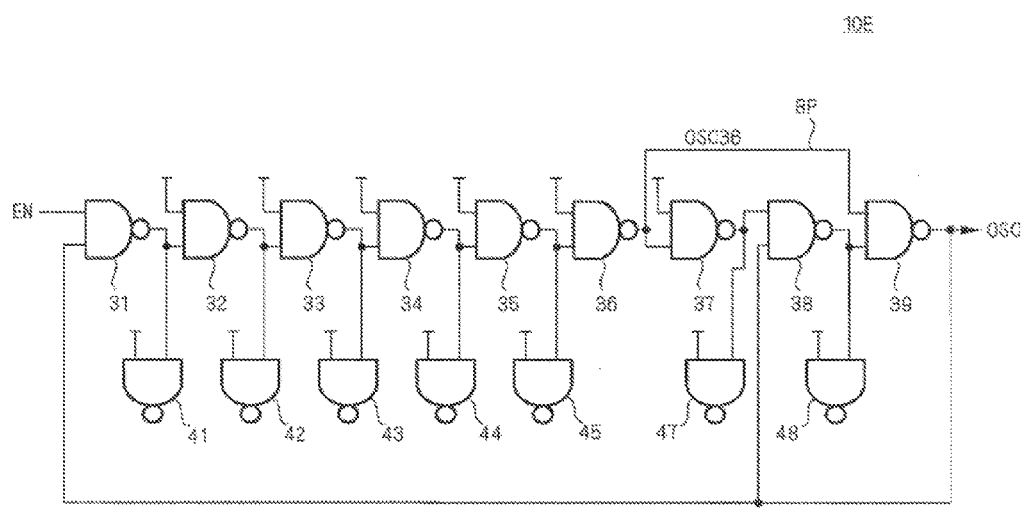
FIG. 6 is a circuit diagram of a configuration of a ring oscillator 10E according to a fifth embodiment of the present invention.

FIG. 6 is a circuit diagram of a configuration of a ring oscillator JOE according to a fifth embodiment of the present invention.

As shown in FIG. 6, the ring oscillator 10E according to the fifth embodiment is different from the ring oscillator 10D of FIG. 5 in that the ring oscillator 10E further includes NAND gate circuits 41 to 45, 47, and 48 that function as dummy loads. In other aspects, the ring oscillator 10E is the same as the ring oscillator 10D, and therefore the same elements will be denoted by the same reference numerals and redundant description will be omitted.

The NAND gate circuits 41 to 45, 47, and 48 have their one input nodes connected to the output nodes of the NAND gate circuits 31 to 35, 37, and 38, respectively. The other input nodes of the NAND gate circuits 41 to 45, 47, and 48 are uniformly fixed to high-voltage level, which is not an essential factor in this embodiment. The output nodes of the NAND gate circuits 41 to 45, 47, and 48 are not connected to any line.

In such a configuration, loads on the NAND gate circuits 31 to 39 become identical with each other. According to the ring oscillator 10D of FIG. 5, the output node of each of the NAND gate circuits 36 and 39 is connected to two input nodes of two NAND gate circuits, while the output node of each of the other NAND gate circuits 31 to 35, 37, and 38 is connected to one input node of one NAND gate circuit. Because of this, the loads on the NAND gate circuits 36 and 39 are different from the loads on the other NAND sate circuits 31 to 35, 37, and 38. This load difference may emerge as a delay time difference. In contrast, according to this embodiment, the output node of every one of the NAND gate circuits 31 to 39 is connected to two input nodes of two NAND gate circuits. This configuration allows equalization of the delay time per unit of delay circuit.

Figure 7:
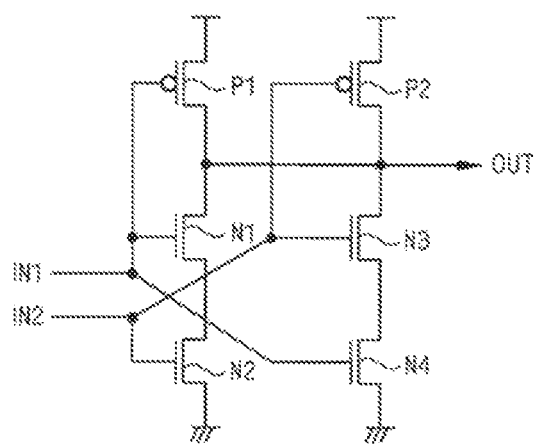
FIG. 7 is an explanatory view of a preferable circuit configuration of each of NAND gate circuits 31 to 39.

FIG. 7 is an explanatory view of a preferable circuit configuration of each of the NAND gate circuits 31 to 39.

The NAND gate circuit shown in FIG. 7 includes a p-channel MOS transistor P1 and n-channel MOS transistors N1 and N2 that are connected in series between voltage lines and a p-channel MOS transistor P2 and n-channel MOS transistors N3 and N4 that are connected in series between voltage lines. The gate electrodes of the transistors P1, N1, and N4 are connected to one input node IN1, while the gate electrodes of the transistors P2, N2 and N3 are connected to the other input node IN2. A connection point between the transistors P1 and N1 and a connection point between the transistors P2 and N3 are connected to an output node OUT.

Using the NAND gate circuit having such a configuration matches circuit conditions for the input node N1 to circuit conditions for the input node N2. Specifically, timing of voltage level shift of the output node OUT in a case where the input node IN2 shifts from a low-voltage level, to a high-voltage level, as the input node IN1 stays at the high-voltage level matches timing of voltage level shift of the output node OUT in a case where the input node IN1 shifts from the low-voltage level to the high-voltage level as the input node IN2 stays at the high-voltage level. Using the NAND gate circuits 31 to 39 each having such a circuit configuration, therefore, allows equalization of the delay time per unit of delay circuit.

As described above, according to the ring oscillators 10A to 10E of the embodiments, the oscillator signal OSC can be generated as the signal whose one cycle's length is defined by even units of delay circuits. The ring oscillators 10A to 10E can be used as various devices without limitation to the type of usage, such as an oscillator serving as a self-refreshing timer and an oscillator serving as a measuring circuit for evaluating the characteristics of a semiconductor device. The ring oscillators 10A to 10E can also be used as a measuring circuit that measure the cycle of a clock signal.

Several examples in which the ring oscillators 10A to 10E of the embodiments are applied to a semiconductor device will hereinafter be described. A ring oscillator 10 to be described in the following paragraphs may be any one of the above ring oscillators 10A to 10E.

Figure 8:
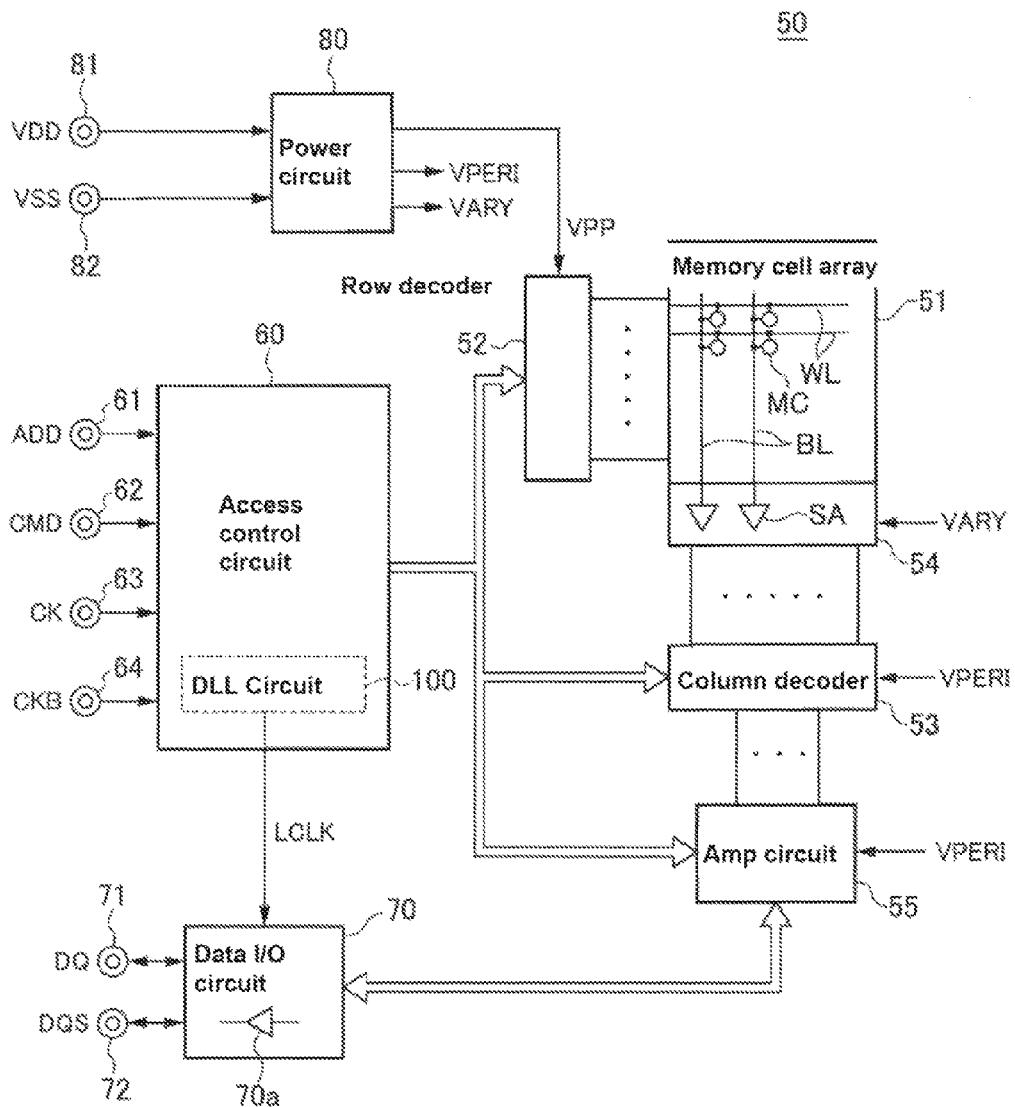
FIG. 8 is a block diagram of an overall configuration of a semiconductor device 50.

FIG. 8 is a block diagram of an overall configuration of a semiconductor device 50.

The semiconductor device 50 of FIG. 8 serves as a DRAM and includes a memory cell array 51. The memory cell array 51 has multiple word lines WL and hit lines BL intersecting with each other and memory cells MC arranged at the intersections of the word lines WL and bit lines BL. A word line WL is selected by a row decoder 52, while a bit line BL is selected by a column decoder 53. Each bit line BL is connected to the corresponding sensing amplifier SA in a sensing circuit 54. The bit line BL selected by the column decoder 53 is thus connected to an amplifying circuit 55 via the sensing amplifier SA.

Operations of the row decoder 52, column decoder 53, sensing circuit 54, and amplifying circuit 55 are controlled by an access control circuit 60, which is supplied with an address signal ADD, a command signal CMD, external clock signals CK and CKB, etc., via external terminals 61 to 64. The external clock signals CK and CKB are signals complementary to each other. Based on these signals, the access control circuit 60 controls the row decoder 52, the column decoder 53, the sensing circuit 54, die amplifying circuit 55, and a data input/output circuit 70.

Specifically, when the command signal CMD represents an active command, the address signal ADD is supplied to the row decoder 52. In response to the incoming address signal ADD, the row decoder 52 selects a word line WL indicated by the address signal ADD. As a result, the memory cell MC corresponding to the word line WL is connected to a bit line BL. Subsequently, the access control circuit 60 activates the sensing circuit 54 at a given timing.

When the command signal CMD represents a read command or write command, the address signal ADD is supplied to the column decoder 53. In response to the incoming address signal ADD, the column decoder 53 connects a bit line BL indicated by the address signal ADD to the amplifying circuit 55. As a result, at execution of a read operation, read data DQ read out from the memory cell array 51 via the sensing amplifier SA 54 is sent through the amplifying circuit 55 and the data input/output circuit 70 and is output from a data terminal 71 to the outside. At execution of a write operation, write data DQ supplied to the semiconductor device 50 via the data terminal 71 and data input/output circuit 70 is sent through the amplifying circuit 55 and sensing amplifier SA and is written to the memory cell MC.

As shown in FIG. 8, the access control circuit 60 includes a DLL circuit 100. The DLL circuit 100 receives the external clock signals CK and CKB and generates a phase-controlled internal clock signal LCLK based on the external clock signals CK and CKB. The DLL circuit 100 will be described in detail later. The internal clock signal LCLK is supplied to an output circuit 70a included in the data input/output circuit 70. As a result, the read data DQ and a data strobe signal DQS are output from the data terminal 71 and a data strobe terminal 72, respectively, in synchronization with the internal clock signal LCLK.

These circuit blocks use internal voltages as their respective operating voltages. The internal voltages are generated by a power circuit 80 shown in FIG. 8. The power circuit 80 receives an external voltage VDD and a ground voltage VSS that are supplied to the power circuit 80 via voltage terminals 81 and 82, and generates internal voltages VPP, VPERI, VARY, etc., based on the external voltage VDD and the ground voltage VSS. The internal voltage VPP is generated by raising the external voltage VDD, while the internal voltages VPERI and VARY are generated by lowering the external voltage VDD.

The internal voltage VPP is a voltage used mainly at the row decoder 52. The row decoder 52 drives a word line WL selected based on the address signal ADD, by supplying it with the internal voltage VPP, thereby turns on a cell transistor included in the memory cell MC. The internal voltage VARY is a voltage used mainly at the sensing circuit 54. When the sensing circuit 54 is activated, one of a pair of bit lines is driven with the internal voltage VARY as the other of the same is driven with the internal voltage VSS to amplify read data. The internal voltage VPERI is used as an operating voltage for most of peripheral circuits including the access control circuit 60. By using the internal voltage VPERI which is lower than the external voltage VDD, as the operating voltage for the peripheral circuits, power consumption by the semiconductor device 50 is reduced.

Figure 9:
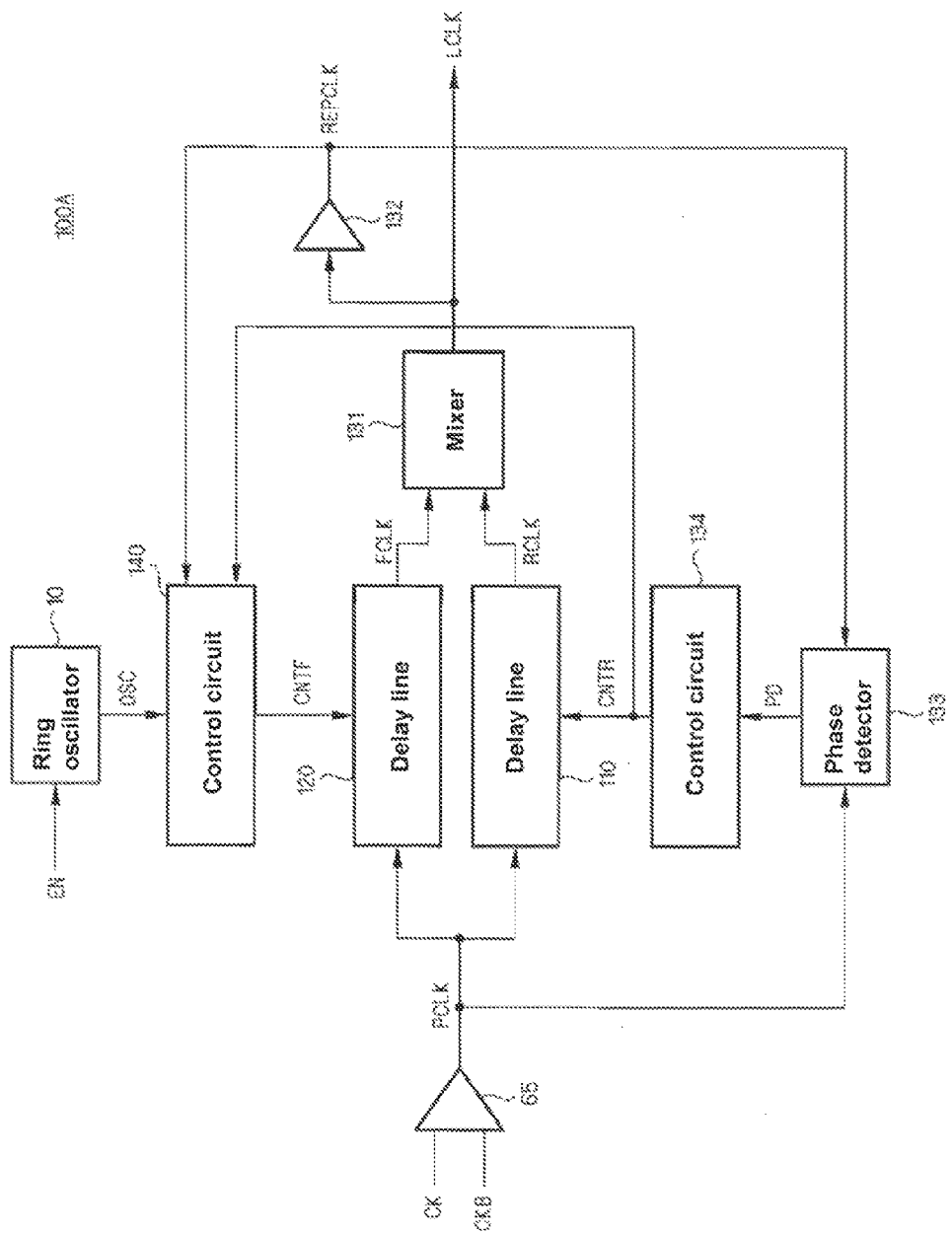
FIG. 9 is a block diagram of a configuration of a DLL circuit 100A according to a sixth embodiment.

FIG. 9 is a block diagram of a configuration of a DLL circuit 100A according to a sixth embodiment.

The DLL circuit 100A of FIG. 9 has delay lines 110 and 120 that generate internal clock signals RCLK and FCLK, respectively, by delaying an internal clock signal PCLK. The internal clock signal PCLK is a signal output from a clock receiver 65 that receives the external clock signals CK and CKB. The internal clock signals RCLK and FCLK output from the delay lines 110 and 120 are synthesized by a synthesizing circuit 131, which synthesizes the internal clock signals RCLK and FCLK to generate the internal clock signal LCLK.

The rising edges of the internal clock signal LCLK synchronize with the rising edges of the internal clock signal RCLK, and the falling edges of the internal clock signal LCLK synchronize with the rising edges of the internal clock signal FCLK. As described above, the internal clock signal LCLK is supplied to the output circuit 70a, where the internal clock signal LCLK is used as a timing signal that determines the output timing of the read data DQ and data strobe signal DQS.

The internal clock signal LCLK is also supplied to a replica circuit 132. The replica circuit 132 has characteristics substantially the same as that of the output circuit 70a, giving the internal clock signal LCLK the same delay as given by the output circuit 70a to output a replica clock signal REPCLK. Because the output circuit 70a outputs the read data DQ and data strobe signal DQS in synchronization with the internal clock signal LCLK, the replica clock signal REPCLK output from the replica circuit 132 synchronizes exactly with the read data DQ and data strobe signal DQS. In the DRAM, the read data DQ and data strobe signal DQS must synchronize exactly with the external clock signals CK and CKB. If a phase shift exists between the read data DQ and data strobe signal DQS and the external clock signals CK and CKB, therefore, the phase shift must be detected and corrected. A phase detector circuit 133 performs such phase shift detection and outputs the result of the detection as a phase difference signal PD.

The phase difference signal PD is supplied to a control circuit 134. The control circuit 134 includes a counter that increases or decreases its count value CNTR based on the phase difference signal PD. The count value CNTR is supplied to the delay line 110, where an amount of delay by the delay line 110 is controlled by the count value CNTR.

The replica clock signal REPCLK and the count value CNTR are supplied also to the control circuit 140. As it will be described later, like the control circuit 134, the control circuit 140 includes a counter, which increases its count value based on the oscillator signal OSC. A calculated value CNTF output from the control circuit 140 is supplied to the delay line 120, where an amount of delay by the delay line 120 is controlled by the calculated value CNTF.

Several examples of the control circuit 140 will hereinafter be described.

Figure 10:
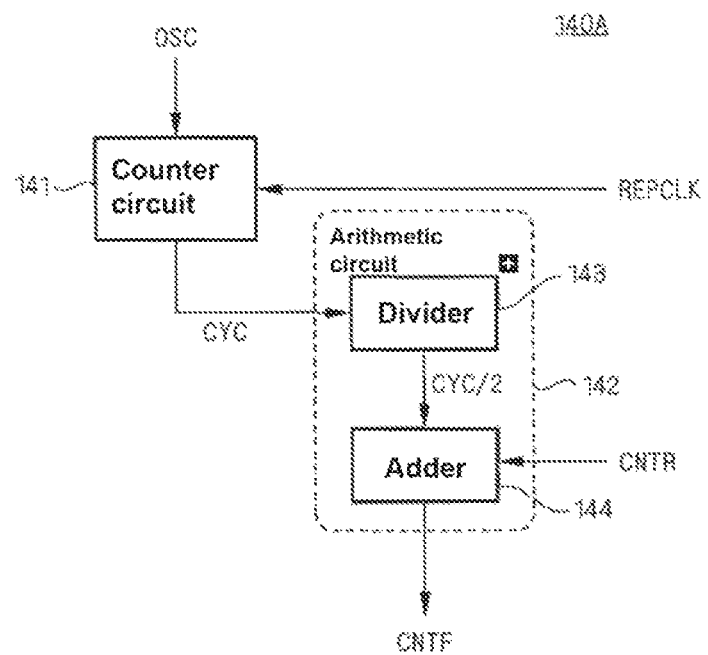
FIG. 10 is a block diagram of a control circuit 140A as a first example.

FIG. 10 is a block diagram of a control circuit 140A as a first example.

The control circuit 140A as the first example includes a counter 141 and an arithmetic circuit 142. The counter 141 is a circuit that counts the number of generations of oscillator signals OSC, and performs a counting operation under control by the replica clock signal REPCLK. Any one of the ring oscillators 10A to 10E of the first to fifth embodiments may be used as the ring oscillator 10 that generates the oscillator signal OSC. Nevertheless, using the ring oscillator 10E with highest precision is preferable.

Figure 11:
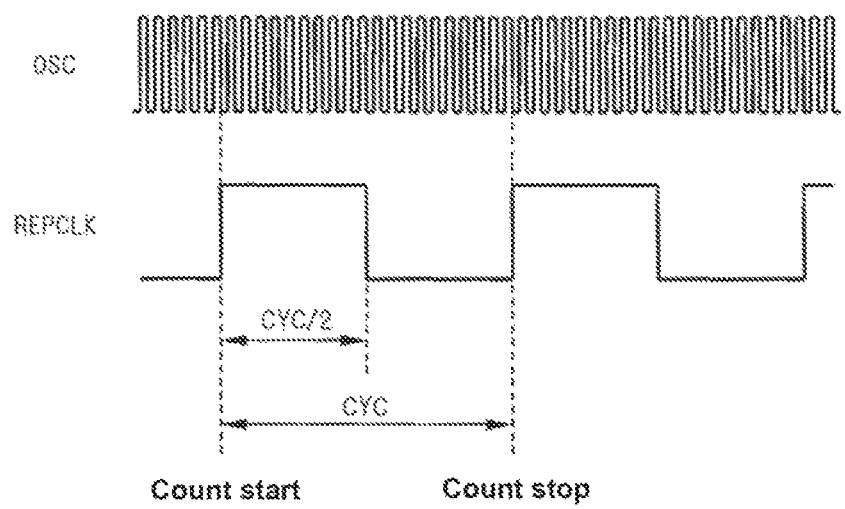
FIG. 11 is a timing chart for explaining an operation of a counter circuit 141.

As shown in FIG. 11, the counter 141 is configured such that it starts counting in synchronization with a rising edge of the replica clock signal REPCLK and ends counting in synchronization with the next rising edge of the replica clock signal REPCLK. As a result, a count value CYC of the counter 141 matches a number of pulses of the oscillator signal OSC that are generated during one cycle of the replica clock signal REPCLK.

The count value CYC of the counter 141 is converted into the calculated value CNTF by the calculating circuit 142. In this example, the calculating circuit 142 is composed of a divider 143 and an adder 144. The divider 143 divides the count value CYC by 2 to produce an intermediate value CYC/2, and then the adder 144 adds up the intermediate value CYC/2 and the count value CNTR to produce the calculated value CNTF. The divider 143 performs the division by omitting the least significant bit (LSB) of the count value CYC.

The calculated value CNTF produced in this manner is supplied to the delay line 120 of FIG. 9. The delay line 120 delays the internal clock signal PCLK according to the calculated value CNTF, thereby generates the internal clock signal FCLK.

Figure 12:
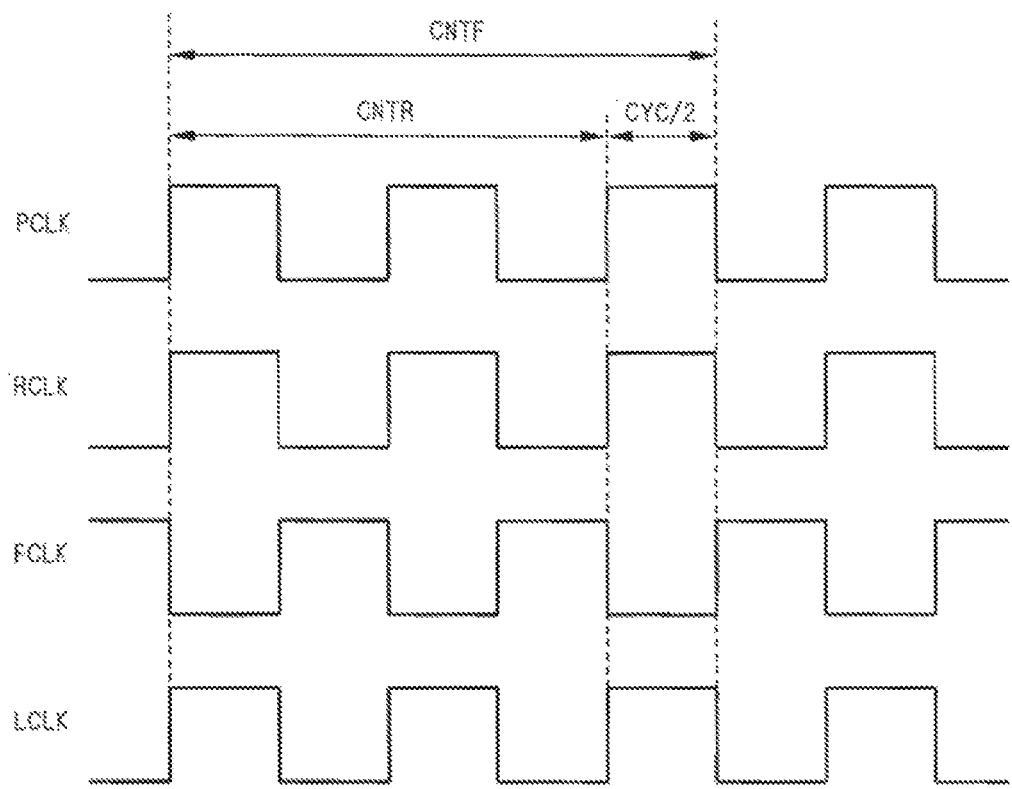
FIG. 12 is a waveform chart of internal clock signals PCLK, RCLK, FCLK, and LCLK.

The intermediate value CYC/2 matches the number of the pulses of the oscillator signal OSC that are generated during the half cycle of the replica clock signal REPCLK. For this reason, the calculated value CNTF produced by adding the count value CNTR to the intermediate value CYC/2 turns out to be a value representing a period between a rising edge of the internal clock signal PCLK and a falling edge of the internal clock signal LCLK, as shown in FIG. 12.

According to this embodiment, the delay lines 110 and 120 are so designed that the adjustment pitch of an amount of delay by the delay lines 110 and 120 matches the cycle of the oscillator signal OSC or is expressed as an integer ratio between an adjustment pitch of the amount of delay and the cycle. For this reason, when the internal clock signal PCLK is delayed through the delay line 120 according to the calculated value CNTF, a rising edge of the resulting internal clock signal FCLK lies at the midpoint between a falling edge of the internal clock signal LCLK and the next failing edge of the same. This allows the duty ratio of the internal clock signal LCLK to be reduced immediately to 50%.

According to this embodiment, the oscillator signal OSC with a cycle length is defined by even units of delay circuits is used. This facilitates designing the delay lines 110 and 120 so that the adjustment pitch of an amount of delay by the delay lines 110 and 120 matches the cycle of the oscillator signal OSC or is expressed as an integer ratio between the adjustment pitch of the amount of delay and the cycle. When the delay time equivalent to the adjustment pitch of the delay lines 110 and 120 is achieved by delay circuits identical in number with one-cycle defining delay circuits making up the ring oscillator 10, the logical level of the internal clock signal is never reversed irrespective of what amount of delay by the delay lines 110 and 120 is set.

An ordinary ring oscillator is composed of an odd number of units of delay circuits. If the adjustment pitch is defined using delay circuits identical in number with those odd number of units of delay circuits, the logical level of the internal clock signals RCLK and FLCK is reversed depending on locations of extraction of the internal clock signals RCLK and FLCK. According to this embodiment, however, the ring oscillator 10 is virtually composed of even units of delay circuits and therefore such logical level reverse does not occur.

Figure 13:
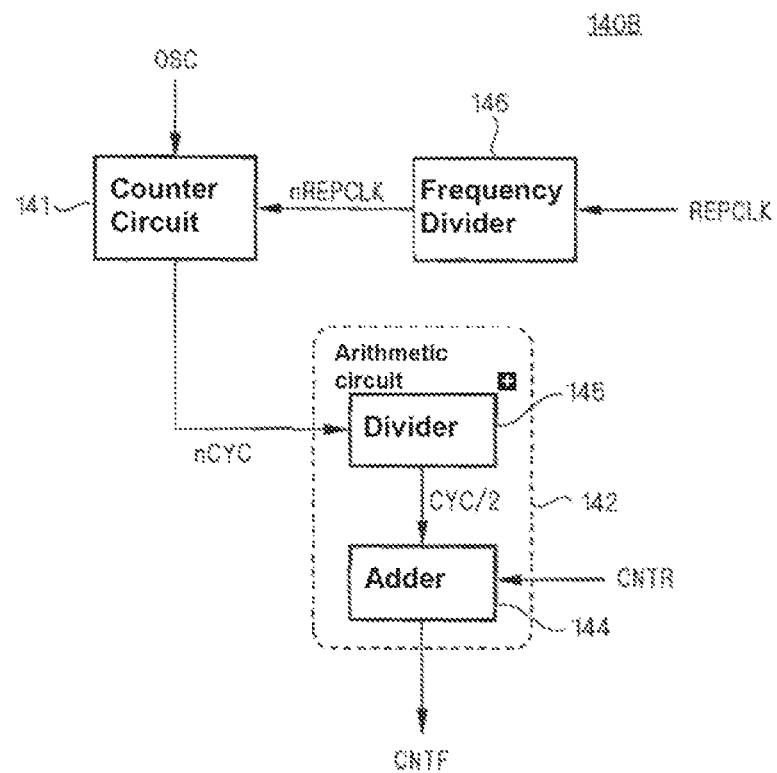
FIG. 13 is a block diagram of a control circuit 140B as a second example.

FIG. 13 is a block diagram of a control circuit 140B as a second example.

The control circuit 140B as the second example is different from the control circuit 140A as the first example of FIG. 10 in that the divider 143 is replaced with a divider 145 and that a frequency-divider circuit 146 is added to the control circuit 140B. In other aspects, the control circuit 140B as the second example is the same as the control circuit 140A as the first example, and therefore the same elements will be denoted by the same reference numerals and redundant description will be omitted.

The frequency-divider circuit 146 is a circuit that generates a frequency-divided signal nREPCLK by dividing the frequency of the replica clock signal REPCLK by a frequency-division number n. It is preferable that the frequency-division number n be the power of 2 (e.g., 16). For example, when the frequency-division number n is determined to be 32, the cycle of the frequency-divided signal nREPCLK is 32 times as large as the cycle of the replica clock signal REPCLK.

Figure 14:
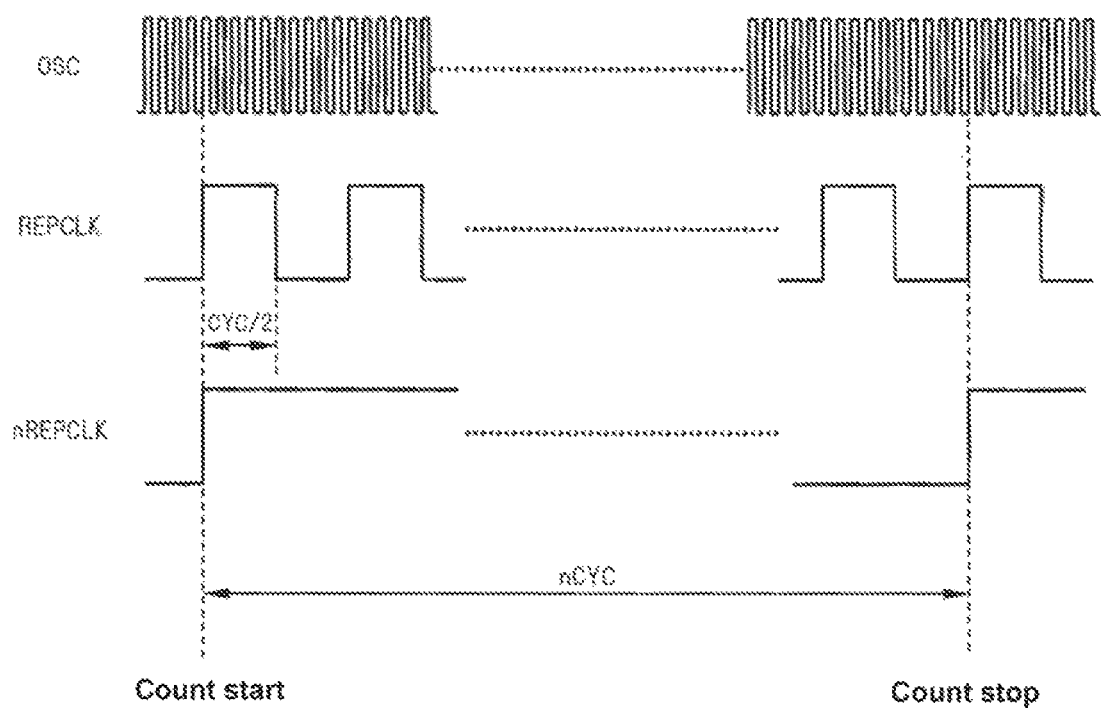
FIG. 14 is a timing chart for explaining an operation of the counter circuit 141.

As shown in FIG. 14, the counter 141 starts counting in synchronization with a rising edge of the frequency-divided signal nREPCLK and ends counting in synchronization with the next rising edge of the frequency-divided signal nREPCLK. This means that the counter 141 carries out oversampling n times the sampling on the replica clock signal REPCLK. As a result a count value nCYC of the counter 141 matches the number of the pulses of the oscillator signal OSC that are generated during n cycles of the replica clock signal REPCLK.

The count value nCYC of the counter 141 is supplied to the divider 145. The divider 145 divides the count value nCYC by 2n to produce an intermediate value CYC/2. When the frequency-division number n represents a value expressed as the power of 2, the divider 145 performs the division by omitting several low-order bits of the count value CYC. For example, when the frequency-division number n is 32, omitting 6 low-order bits of the count value CYC is enough. The intermediate valise CYC/2 obtained in this manner is added by the adder 144 to the count value CNTR to produce the calculated value CNTF. The calculated value CNTF produced in this manner is supplied to the delay line 120 of FIG. 9.

According to this example, the count value nCYC n time the count value CYC is produced by the oversampling. As a result, the calculated value CNTF with higher precision, can be produced.

Figure 15:
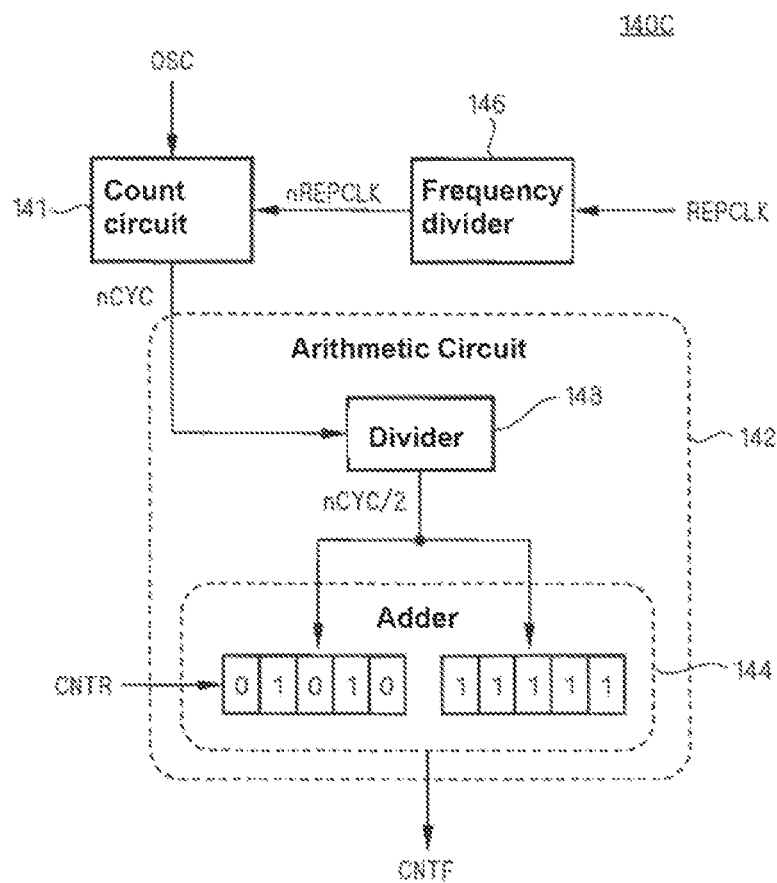
FIG. 15 is a block diagram of a control circuit 140C as a third example.

FIG. 15 is a block diagram of a control circuit HOC as a third example.

The control circuit 140C as the third example is different from the control circuit 140B as the third example of FIG. 13 in that the divider 145 is replaced with the divider 143 and that the count value CNTR is added to high-order bits of a value in the adder 144. In other aspects, the control circuit HOC as the third example is the same as the control circuit 140B as the second example, and therefore the same elements will be denoted by the same reference numerals and redundant description will be omitted.

In this example, the divider 143 divides the count value nCYC simply by 2 and enters nCYC/2 in, for example, a 10-bit counter included in the adder 144. In the example of FIG. 15, the adder 144 has a high-order counter 144a corresponding to five high-order bits and a low-order counter 144b corresponding to five low-order bits. The count value CNTR is added to high-order hits in the high-order counter 144a.

Figure 16:
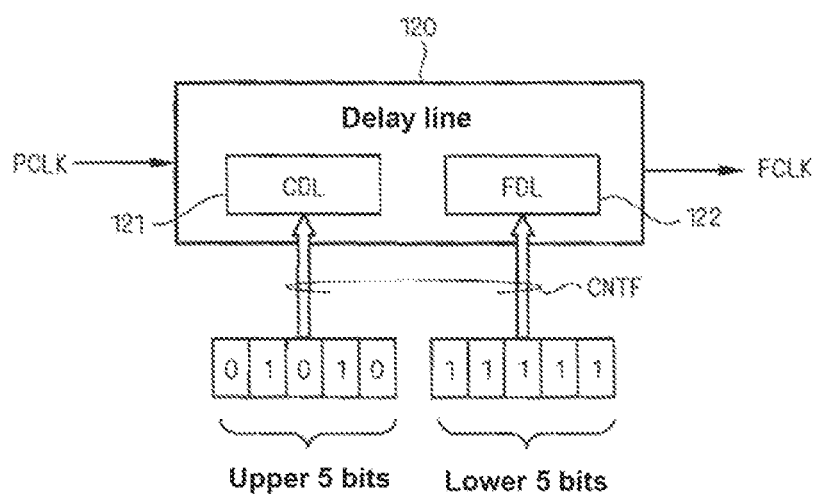
FIG. 16 is a block diagram of a configuration of a delay line 120.

FIG. 16 is a block diagram of a configuration of the delay line 120.

In the example of FIG. 16, the delay line 120 is composed, of a coarse delay line (CDL) 121 and a fine delay line (FDL) 122. An amount of delay by the coarse delay line (CDL) 121 and an amount of delay by the fine delay line (FDL) 122 are controlled respectively by five high-order bits of the calculated value CNTF supplied from the high-order counter 144a and five low-order bits of the calculated value CNTF supplied from the low-order counter 144b. The coarse delay line 121 has a large delay amount adjustment pitch while the fine delay line 122 has a small delay amount adjustment pitch. In this example, the maximum amount of delay by the fine delay line 122 corresponds to the minimum amount of delay by the coarse delay line 121.

In this configuration, for example, when the adjustment pitch of the coarse delay line 121 matches the cycle of the oscillator signal OSC, the fine delay line 122 can be controlled by five low-order bits of the calculated value CNTF produced by the oversampling. In this case, if the number of units of delay circuits making up the ring oscillator 10 is virtually determined to be the power of 2, correlating the cycle of the oscillator signal OSC with the adjustment pitch of the coarse delay line 122 becomes easy. In other words, in this case, the relationship between an amount of delay by each delay circuit making up the ring oscillator 10 and the adjustment pitch of the fine delay line 122 is always expressed as an integer ratio. This makes circuit designing extremely easier.

In the above manner, the DLL circuit 100A of the sixth embodiment controls the position of falling edges of the internal clock signal LCLK, using the ring oscillator 10, and therefore functions as a so-called DCC circuit. According to this embodiment, the calculating circuit 142 includes the adder 144. This adder 144 may be replaced with a subtractor.

Figure 17:
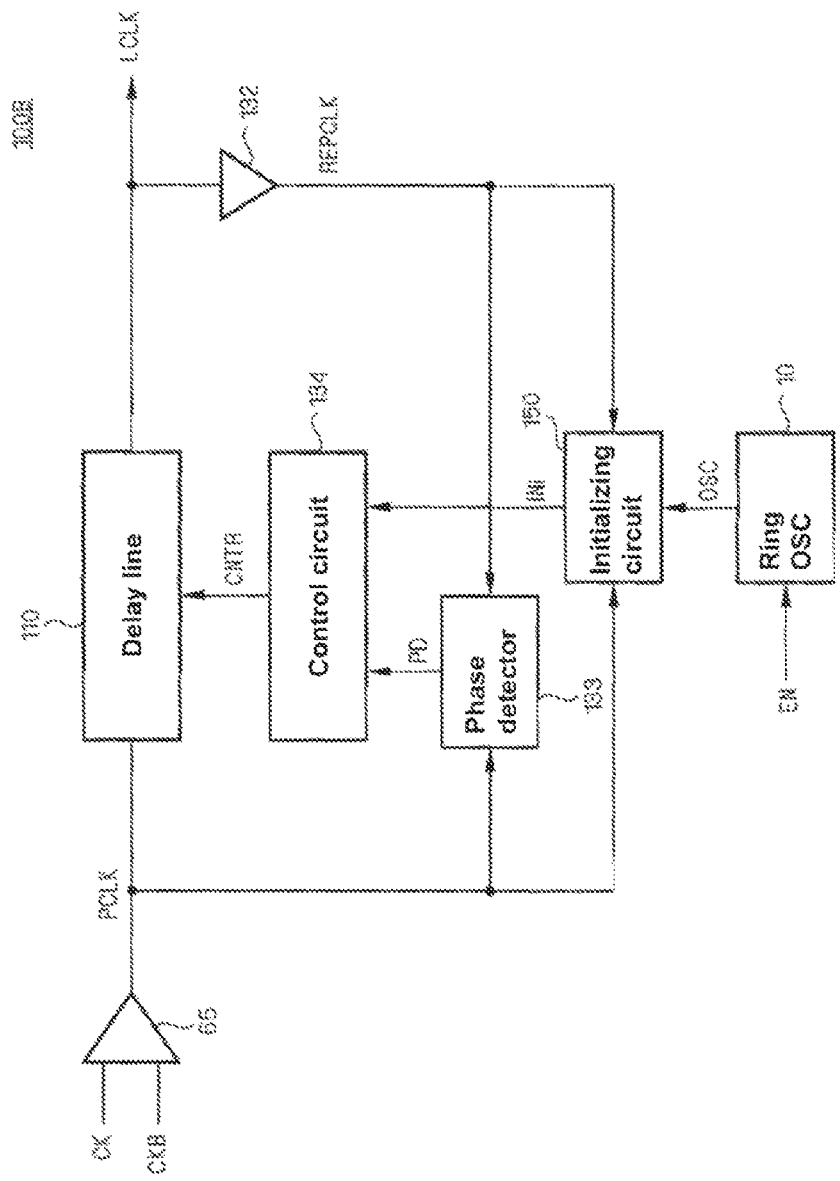
FIG. 17 is a block diagram of a configuration of a DLL circuit 100B according to a seventh embodiment.

FIG. 17 is a block diagram of a configuration of a DLL circuit 100B according to a seventh embodiment.

The DLL circuit 100B of FIG. 17 has the delay line 110 that generates the internal clock signal LCLK by delaying the internal clock signal PCLK. The internal clock signal LCLK is supplied to the replica circuit 132, which generates the replica clock signal REPCLK. The replica clock signal REPCLK is supplied to the phase detector circuit 133 and to an initial setting circuit 150. As described above, the phase detector circuit 133 detects the phases of the internal clock signals PCLK and LCLK, thereby generates the phase difference signal PD and supplies it to the control circuit 134.

The initial setting circuit 150 is a circuit that detects an initial phase difference between the internal clock signal PCLK and the internal clock signal LCLK. An initial phase difference signal IN1 resulting from the detection is supplied to the control circuit 134.

Figure 18:
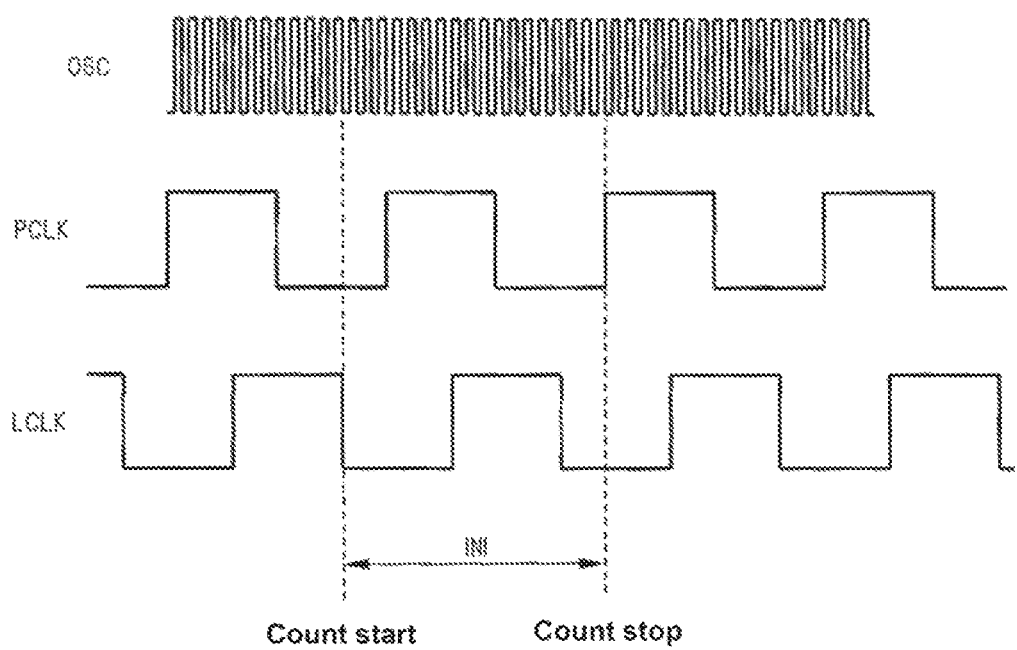
FIG. 18 is a timing chart for explaining an operation of an initial setting circuit 150.

FIG. 18 is a timing chart for explaining an operation of the initial setting circuit 150.

As shown in FIG. 18, when the DLL circuit 100B is reset, the initial setting circuit 150 starts pulse counting on the oscillator signal OSC in synchronization with a rising edge of the internal clock signal LCLK and ends pulse counting on the oscillator signal OSC in synchronization with a rising edge of the internal clock signal PCLK. An obtained count value, therefore, indicates an initial phase difference between the internal clock signal PCLK and the internal clock signal LCLK. The obtained count value is thus supplied as the initial phase difference signal INI, to the control circuit 134, which controls an amount of delay by the delay line 110 based on the initial phase difference signal INI. Hence the initial phase difference is eliminated immediately to put the DLL circuit 100B in nearly locked state.

In this manner, the DLL circuit 100B of the seventh embodiment detects an initial phase difference between the internal clock signal PCLK and the internal clock signal LCLK, using the ring oscillator 10. This allows the DLL circuit 100B to be quickly put in locked state.

As described above, the ring oscillator 10 according to the embodiments is applied preferably to the DLL circuit 100 included in the semiconductor device 50.

The preferred embodiments of the present invention have been described above. The present invention is not limited to the above embodiments but may be modified into various forms of applications on the condition that the modification does not deviate from the substance of the invention. It is obvious that the modified forms of applications are also included in the scope of the invention.

For example, in the ring oscillators 10A to 10E, the delay circuit receiving the incoming enable signal EN is provided as the NAND gate circuit. However, this NAND gate circuit may be replaced with a NOR gate circuit. In such a case, other delay circuits are also provided as NOR gate circuits, of which the other input nodes are uniformly fixed to the low-voltage level.

What is claimed is:

1. A semiconductor apparatus comprising:
a ring oscillator configured to output a first logic level generated by a first odd number of NAND gates and configured to output a second logic level, different from the first logic level, generated by a second odd number of NAND gates, different from the first odd number, wherein the second odd number of NAND gates comprises the first number of NAND gates and wherein the first odd number of NAND gates comprises a first NAND gate including a first input node coupled to a first node and second input node coupled to an enable signal that activates the ring oscillator; and
a selector switch configured to:
receive the first logic level and the second logic level and configured to output to the first input node an oscillation signal selected from the first logic level and the second logic level according to a selection signal provided to a selection input of the selector switch, wherein the selection signal is provided by one of the first odd number of NAND gates.

2. The semiconductor device as claimed in claim 1, wherein at least one of the plurality of NAND gates includes an output node coupled to an input node of a NAND gate.

3. A ring oscillator circuit comprising:
a first NAND gate including a first input node coupled to a first node, a second input node coupled to a second node and an output node coupled to an output terminal;
a second NAND gate including a first input node coupled to a third node, a second input node coupled to the output terminal and an output node coupled to the second node;
a third NAND gate including a first input node operable to couple to a power supply line, a second input node coupled to the first node and an output node coupled to the third node; and
an N number of NAND gates coupled between the first node and the output terminal, wherein N is an even number larger than 1.

4. The circuit as claimed in claim 3, wherein the N number of NAND gates includes a fourth NAND gate including a first input node operable to receive an enable signal.

5. The circuit as claimed in claim 3, wherein the N number of NAND gates includes a fifth NAND gate including a first input node operable to couple to the power supply line.

6. The circuit as claimed in claim 3, wherein the third NAND gate includes an M number of NAND gates coupled between the third node and the output terminal, wherein M is odd number larger than 0.

7. The circuit as claimed in claim 3, further comprising a fifth NAND gate including a first input node coupled to the second node and a second input node operable to couple to the power supply line, and a sixth NAND gate including a first input node coupled to the third node and a second input node operable to couple to the power supply line.

8. A delay locked loop (DLL) circuit comprising:
a delay line configured to receive an input clock signal and to delay the input clock signal responsive to a control signal to generate a delayed clock signal;
a phase detector configured to receive the input clock signal and the delayed clock signal and to output a phase difference signal responsive to a phase difference between the input clock signal and the delayed clock signal;
a ring oscillator coupled to an output node and configured to output a clock signal including a first logic level generated by a first odd number of delay circuits, and a second logic level different from the first logic level generated by a second odd number of delay circuits different from the first odd number of delay circuits; and
a control circuit operable to generate the control signal responsive to the clock signal and the phase difference signal.

9. The DLL circuit as claimed in claim 8, wherein the ring oscillator includes a plurality of unit elements each including a unit delay value.

10. The DLL circuit as claimed in claim 9, wherein the plurality of unit elements includes a plurality of inverters.

11. The DLL circuit as claimed in claim 9, wherein the plurality of unit elements includes a plurality of NAND gates.

12. The DLL circuit as claimed in claim 11, wherein at least one of the plurality of NAND gates includes an output node coupled to an input node of a NAND gate.

13. The DLL circuit as claimed in claim 8, wherein the control circuit includes:
   a counter circuit configured to receive the clock signal and the delayed clock signal and to output a count value responsive to the clock signal and the delayed clock signal;
   a divider configured to receive the count value and to output a divided count value; and
   an adder configured to receive the divided count value and another control signal and to output the control signal.

14. The DLL circuit as claimed in claim 13, wherein the counter circuit is configured to count a period of the delayed clock signal responsive to the clock signal.

15. A semiconductor apparatus comprising:
   a ring oscillator configured to output a first logic level generated by a first odd number of NAND gates and configured to output a second logic level, different from the first logic level, generated by a second odd number of NAND gates, different from the first odd number,
   wherein the second odd number of NAND gates comprises the first number of NAND gates and wherein the first odd number of NAND gates comprises a first NAND gate including a first input node coupled to a first node and second input node coupled to an enable signal that activates the ring oscillator, and
   wherein the first NAND gate further includes a first output node coupled to the selection input of the selector switch to provide the selection signal to the selector switch; and
   a selector switch configured to receive the first logic level and the second logic level and configured to output to the first input node an oscillation signal selected from the first logic level and the second logic level according to a selection signal provided to a selection input of the selector switch.

16. The semiconductor apparatus as claimed in claim 15, wherein the first odd number of NAND gates further comprises a second NAND gate including a first input node coupled to the first output node of the first NAND gate.

* * * * *